(12) United States Patent
Wu et al.

(10) Patent No.: US 10,276,234 B2
(45) Date of Patent: Apr. 30, 2019

(54) SB—TE—TI PHASE-CHANGE MEMORY MATERIAL AND TI—SB2TE3 PHASE-CHANGE MEMORY MATERIAL

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Liangcai Wu, Shanghai (CN); Min Zhu, Shanghai (CN); Zhitang Song, Shanghai (CN); Feng Rao, Shanghai (CN); Cheng Peng, Shanghai (CN); Xilin Zhou, Shanghai (CN); Kun Ren, Shanghai (CN); Songlin Feng, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

(*) Notice: Subject to any disclaimer, the term of this patent is extended or adjusted under 35 U.S.C. 154(b) by 456 days.

(21) Appl. No.: 14/966,348

(22) Filed: Dec. 11, 2015

(65) Prior Publication Data
US 2016/0099050 A1  Apr. 7, 2016

Related U.S. Application Data

(63) Continuation-in-part of application No. 13/885,894, filed as application No. PCT/CN2012/087572 on Dec. 26, 2012.

(30) Foreign Application Priority Data

Mar. 21, 2012 (CN) .......................... 2012 1 0076491

(51) Int. Cl.
*G11C 13/00* (2006.01)
*H01L 45/00* (2006.01)

(52) U.S. Cl.
CPC .......... *G11C 13/0004* (2013.01); *H01L 45/06* (2013.01); *H01L 45/144* (2013.01); *H01L 45/1625* (2013.01)

(58) Field of Classification Search
CPC . G11C 13/0004; H01L 45/1625; H01L 45/06; H01L 45/144
See application file for complete search history.

(56) References Cited

U.S. PATENT DOCUMENTS

2005/0029502 A1  2/2005  Hudgens
2006/0256702 A1  11/2006  Kurokawa

FOREIGN PATENT DOCUMENTS

| CN | 1862683 A | 11/2006 |
| CN | 101383398 A | 3/2009 |
| CN | 102268738 A | 12/2011 |
| CN | 102569652 A | 7/2012 |
| CN | 102593355 A | 7/2012 |

OTHER PUBLICATIONS

Drasar, et al., "Transport coefficients of titanium-doped Sb2Te3 single crystals," Journal of Solid State Chemistry, vol. 178, pp. 1301-1307, 2005.
Wei, et al., "Phase change behavior in titanium-doped Ge2Sb2Te3 films," Applied Physics Letters, vol. 98, pp. 231910-1-231910-3, 2011.

(Continued)

*Primary Examiner* — Peter F Godenschwager
*Assistant Examiner* — Andrew J. Oyer
(74) *Attorney, Agent, or Firm* — Oliff PLC

(57) ABSTRACT

An Sb—Te—Ti phase-change thin-film material applicable to a phase-change memory and preparation thereof. The Sb—Te—Ti phase-change memory material is formed by (Continued)

doping an Sb—Te phase-change material with Ti, Ti forms bonds with both Sb and Te, and the Sb—Te—Ti phase-change memory material has a chemical formula $Sb_xTe_yTi_{100-x-y}$, where $0<x<80$ and $0<y<100-x$. When the Sb—Te—Ti phase-change memory material is a Ti—$Sb_2Te_3$ phase-change memory material, Ti atoms replace Sb atoms, and phase separation does not occur. The crystallization temperature of the Sb—Te—Ti phase-change memory material is significantly risen, retention is improved, and thermal stability is enhanced; meanwhile, the amorphous state resistance decreases, and the crystalline state resistance increases; and the Sb—Te—Ti phase-change memory material has wide application in phase-change memories.

1 Claim, 4 Drawing Sheets

(56) References Cited

OTHER PUBLICATIONS

Kulbachinskii, et al., "Influence of Ti doping on galvanomagnetic properties and valence band energy spectrum of Sb2—xTixTe3 single crystals," Journal of Physics: Condensed Matter, vol. 11, pp. 5273-5282, 1999.
Gan, "Structure and properties of amorphous thin film for optical data storage," Journal of Non-Crystalline Solids, vol. 354, pp. 1089-1099, 2008.
Apr. 4, 2013 International Search Report issued in International Patent Application No. PCT/CN2012/087572.
Apr. 4, 2013 Partial Translation of Written Opinion issued in International Patent Application No. PCT/CN2012/087572.

SB—TE—TI PHASE-CHANGE MEMORY MATERIAL AND TI—SB2TE3 PHASE-CHANGE MEMORY MATERIAL

BACKGROUND

Field of Invention

The present invention relates to a phase-change material and a preparation method thereof, and more particularly to an Sb—Te—Ti phase-change thin-film material applicable to a phase-change memory.

Description of Related Art

Phase-change memory (or Phase Change Random Access Memory, PCRAM for short) use phase change materials, i.e. chalcogenide compounds as storage medium, which may be electrically switched between a generally crystalline state (relatively lower resistance) and a generally amorphous state (relatively higher resistance) by utilizing electric energy (heat) for electronic memory application in order to write and erase information. Information read is relied on the measured resistance, in which whether it is a higher resistance representing "1" or a lower resistance representing "0" is determined.

Grain growth dominates during a crystallization process of Sb—Te based phase-change materials, resulting in a high phase-change rate and a lower melting point than that of $Ge_2Sb_2Te_5$ (GST). As a result, less power is consumed. However, the Sb—Te based phase-change materials have such disadvantages as a low crystallization temperature, poor thermal stability, and poor data retention.

An $Sb_2Te_3$ phase-change material has a very high crystallization rate, and meanwhile a low melting point. However, $Sb_2Te_3$ has a very low crystallization temperature, and a very poor thermal stability. For consumer electronics, a non-volatile memory is required to store data for at least 10 years under the condition of 85° C., and even stricter requirements exist in industrial electronics. Without being doped, the $Sb_2Te_3$ phase-change material cannot be applied to a phase-change memory.

In the present invention, the $Sb_2Te_3$ phase-change material is doped with Ti to significantly rise the crystallization temperature, so as to improve the data retention, thereby satisfying practical requirements.

SUMMARY

An objective of the present invention is to provide an Sb—Te—Ti phase-change material for a phase-change memory, so as to improve the thermal stability and increase the amorphous state resistance of the phase-change material, and reduce a Reset current and the melting temperature of the material.

The present invention further provides a Ti—$Sb_2Te_3$ phase-change memory material with Ti doped, which is used for a phase-change memory, so as to improve the thermal stability and increase the amorphous state resistance. Meanwhile, after being doped with Ti, gains become smaller, and phase separation does not occur. The melting point and the thermal conductivity of the Ti—$Sb_2Te_3$ phase-change memory material doped with Ti are both lower than before. In a phase-change memory based on this phase-change material, as the content of Ti increases, the high resistance increases firstly and then decreases, and the high-resistance-to-low-resistance ratio also increases at first and then decreases.

In order to solve the above technical problems, the present invention is implemented by adopting the following technical solutions.

An Sb—Te—Ti phase-change memory material for a phase-change memory is provided, which is formed by doping an Sb—Te phase-change material with Ti, and has a chemical formula $Sb_xTe_yTi_{100-x-y}$, where $0<x<80$, and $0<y<100-x$. In the chemical formula of the present invention, right subscripts represent the molar ratio.

Preferably, x satisfies $45 \leq x \leq 72$, and y satisfies $5 \leq y \leq 45$. More preferably, $y=x/2$.

In the Sb—Te—Ti phase-change memory material, doped Ti forms chemical bonds with both Sb and Te.

Preferably, the Sb—Te—Ti phase-change memory material is an Sb—Te—Ti phase-change thin-film material. Preferably, the thickness of the Sb—Te—Ti phase-change thin-film material is in the range of 100 to 250 nm.

Preferably, the resistivity of the Sb—Te—Ti phase-change memory material is reversibly changed under the action of an electric pulse.

Preferably, the optical reflectivity of the Sb—Te—Ti phase-change memory material is reversibly changed under the action of a laser pulse.

The crystallization temperature of the Sb—Te—Ti phase-change memory material is significantly risen, the thermal stability and the data retention are both improved.

The amorphous state resistance of the Sb—Te—Ti phase-change memory material is decreased, and the crystalline state resistance is increased.

In the Sb—Te—Ti phase-change memory material for a phase-change memory according to the present invention, the Sb—Te phase-change memory material is an $Sb_2Te_3$ phase-change memory material, the Sb—Te—Ti phase-change memory material obtained by doping the $Sb_2Te_3$ phase-change memory material with Ti is a Ti—$Sb_2Te_3$ phase-change memory material with the chemical formula $Sb_xTe_yTi_{100-x-y}$, $$y = \frac{3}{2}x,$$

and the Ti atom percentage content is lower than 50%.

Preferably, in the Ti—$Sb_2Te_3$ phase-change memory material, the percentage content of Ti is in the range of 2% and 20%.

Preferably, in the Ti—$Sb_2Te_3$ phase-change memory material, Ti atoms replace Sb atoms, and phase separation does not occur.

Preferably, the resistivity of the Ti—$Sb_2Te_3$ phase-change memory material is reversibly changed under the action of an electric pulse.

Preferably, the optical reflectivity of the Ti—$Sb_2Te_3$ phase-change memory material is reversibly changed under the action of a laser pulse.

Preferably, in the Ti—$Sb_2Te_3$ phase-change memory material, as the content of doped Ti increases, the amorphous state resistance of the Ti—$Sb_2Te_3$ phase-change memory material increases and then decreases.

Preferably, the crystallization temperature of the Ti—$Sb_2Te_3$ phase-change memory material is significantly risen, and the thermal stability and the data retention are improved.

Preferably, gains of the Ti—$Sb_2Te_3$ phase-change memory material are smaller (compared with grains of $Sb_2Te_3$), and phase separation does not occur.

Preferably, the melting point and the thermal conductivity of the Ti—Sb$_2$Te$_3$ phase-change memory material are lowered.

A preparation method of an Sb—Te—Ti phase-change memory material according to the present invention includes the following steps.

According to a ratio of Sb to Te in a chemical formula Sb$_x$Te$_y$Ti$_{100-x-y}$, an Sb$_x$Te$_y$ alloy target and a Ti target are co-sputtered to obtain the Sb—Te—Ti phase-change memory material.

Preferably, sputtering conditions of the co-sputtering are: in the process of co-sputtering, an Ar gas with a purity of 99.999% is fed at the same time, the Sb$_x$Te$_y$ target adopts a radio frequency power supply, and the Ti target adopts a direct current power supply. Preferably, the power of the radio frequency power supply is 25 W, and the power of the direct current power supply is 15 W.

Preferably, during co-sputtering, the Sb$_x$Te$_y$ alloy target is started before the Ti target power supply is turned on.

Preferably, the co-sputtering duration is 15 minutes to 50 minutes.

The obtained Sb—Te—Ti phase-change memory material is a phase-change thin-film material, and the thickness of the film is in the range of 100 nm to 250 nm.

A sputtering device used in the present invention is a conventional sputtering device in the prior art.

The present invention further provides a phase-change memory unit based on an Sb—Te—Ti phase-change memory material.

Preferably, the Sb—Te—Ti phase-change memory material is a Ti—Sb$_2$Te$_3$ phase-change material doped with Ti.

Preferably, in the phase-change memory unit based on the Ti—Sb$_2$Te$_3$ phase-change material doped with Ti, after being doped with Ti, grains of the Sb$_2$Te$_3$ phase-change memory material become smaller, so the adhesion of the Ti—Sb$_2$Te$_3$ phase-change memory material to upper and lower electrodes increases.

Preferably, in the phase-change memory unit based on the Ti—Sb$_2$Te$_3$ phase-change material doped with Ti, as the content of the doped Ti increases, a Reset voltage of the phase-change memory unit increases.

Preferably, in the phase-change memory unit based on the Ti—Sb$_2$Te$_3$ phase-change material doped with Ti, as the content of the doped Ti increases, the high resistance and the low resistance of the phase-change memory unit are more stable.

Preferably, in the phase-change memory unit based on the Ti—Sb$_2$Te$_3$ phase-change material doped with Ti, as the content of the doped Ti increases, the high resistance of the phase-change memory unit increases and then decreases, and similarly, the high-resistance-to-low-resistance ratio also increases and then decreases.

Preferably, the high-resistance-to-low-resistance ratio of the phase-change memory unit based on the Ti—Sb$_2$Te$_3$ phase-change material doped with Ti is greater than an order of magnitude.

Preferably, the phase-change memory unit based on the Ti—Sb$_2$Te$_3$ phase-change material doped with Ti has a very high Set operation speed (on the order of nanosecond).

Preferably, the phase-change memory unit based on the Ti—Sb$_2$Te$_3$ phase-change material doped with Ti has a great number of repeated operations.

Beneficial effects of the present invention are as follows.

According to the present invention, the Sb—Te phase-change memory material is doped with Ti, Ti forms bonds with both Sb and Te, and the crystallization temperature Sb—Te—Ti phase-change memory material obtained by doping Ti is risen, the data retention is improved, and the thermal stability is enhanced. The crystalline state resistance increases, and the Reset power consumption decreases.

In the Ti—Sb$_2$Te$_3$ phase-change memory material of the present invention, Ti atoms replace Sb atoms, and phase separation does not occur; the Ti—Sb$_2$Te$_3$ phase-change memory material is evenly distributed, and the grains are small; the crystallization temperature is significantly risen, and the thermal stability and the data retention are enhanced; as the content of the doped Ti increases, the amorphous state resistance of the Ti—Sb$_2$Te$_3$ phase-change memory material increases and then decreases; the melting point and thermal conductivity are lowered.

DETAILED DESCRIPTION OF THE PREFERRED EMBODIMENTS

The present invention is further illustrated below with reference to specific embodiments, and it should be understood that the embodiments are only intended to illustrate the present invention, but are not intended to limit the protection scope of the present invention.

Embodiment 1

Preparation of an Sb$_{60}$Te$_{30}$Ti$_{10}$ Nanocomposite Phase-Change Material In this embodiment, the nanocomposite phase-change material is obtained by co-sputtering an Sb$_{60}$Te$_{30}$ alloy target and a Ti target. Specific preparation conditions are: in the process of co-sputtering, an Ar gas with a purity of 99.999% is fed at the same time, the Sb$_{60}$Te$_{30}$ target adopts a radio frequency power supply, the Ti target adopts a direct current power supply, the power of the adopted radio frequency power supply is 25 W, and the power of the adopted direct current power supply is 15 W. The Sb2Te target is started before the Ti target power supply is turned on. The co-sputtering duration is 20 minutes, and the thickness of a film is about 170 nm.

Figure 1:
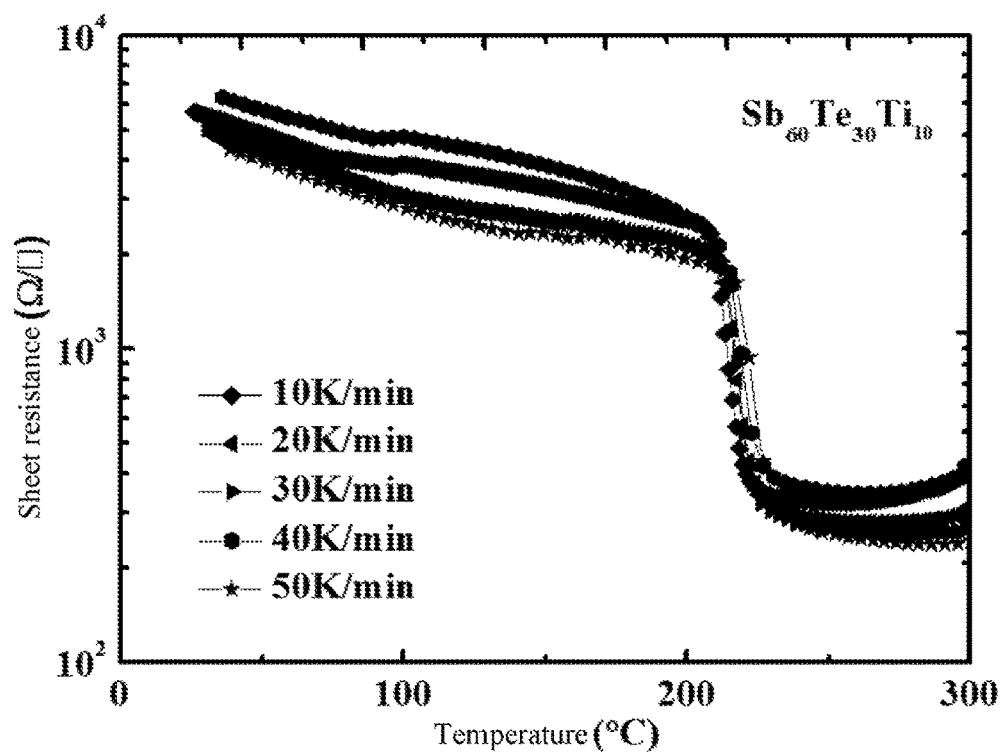
FIG. 1 is a graph showing a relationship between the sheet resistance and the temperature of an Sb$_{60}$Te$_{30}$Ti$_{10}$ film at different heating rates.
Figure 2:
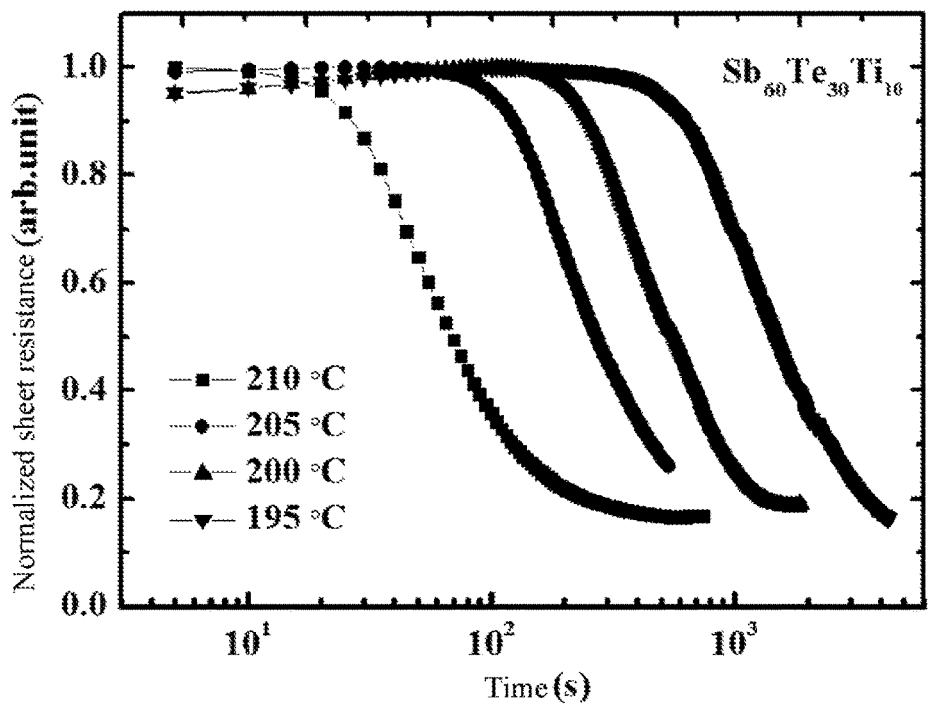
FIG. 2 shows the retention time of an Sb$_{60}$Te$_{30}$Ti$_{10}$ film at different temperatures in Embodiment 1.
Figure 3:
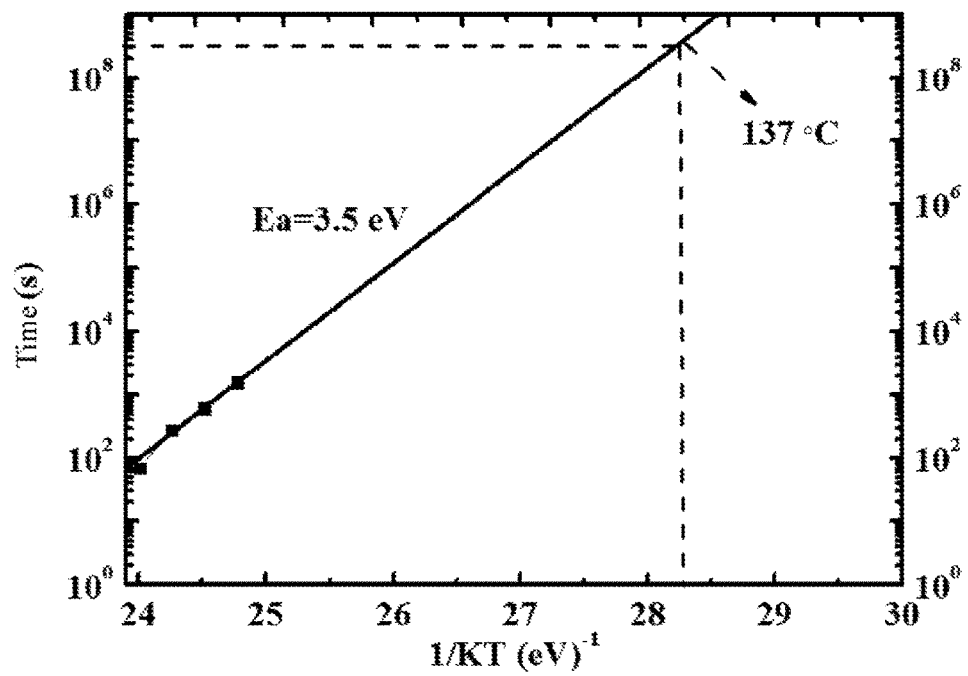
FIG. 3 shows the crystallization activation energy and a 10-year retention temperature of an Sb$_{60}$Te$_{30}$Ti$_{10}$ film in Embodiment 1.

Tests of the Sb$_{60}$Te$_{30}$Ti$_{10}$ nanocomposite phase-change material obtained in this embodiment are performed, and results are shown in FIG. 1 to FIG. 3.

FIG. 1 is a graph showing a relationship between the Sb$_{60}$Te$_{30}$Ti$_{10}$ sheet resistance and the temperature at different heating rates. The applied heating rate is in the range of 10° C./min to 50° C./min. The crystallization temperature of the pure $Sb_{60}Te_{30}$ at the heating rate of 10° C./min is about 130° C.; after doped with Ti, the crystallization temperature is about 212° C., which is higher than the initial crystallization temperature by 80° C. and more. The higher the heating rate is, the higher the crystallization temperature is, because when the heating rate is high, atoms do not have enough time to diffuse, and the time for crystallization gets longer.

FIG. 2 is a graph showing the retention time of the $Sb_{60}Te_{30}Ti_{10}$ film at different temperatures. The retention is a critical property of the phase-change material, and is an important parameter for determining whether the phase-change material can be directly applied. It can be seen from the above discussion that the crystallization temperature of $Sb_{60}Te_{30}Ti_{10}$ is 212° C., and test temperature points of retention are 195° C., 200° C., 205° C., and 210° C. respectively, as shown in FIG. 2. The reason is that the test temperature point of the retention needs to be lower than the crystallization temperature. The retention is used to characterize the thermal stability in the amorphous state. When the test temperature point is higher than the crystallization temperature, the phase-change material has been crystallized in the process of heating, so that the retention time of the amorphous state cannot be measured. Herein, the failure time is defined as time required for the resistance of the film to decrease to half of the initial resistance when the temperature just rises to the test temperature point. According to the test, the failure time corresponding to 195° C., 200° C., 205° C., and 210° C. is 1,560 s, 610 s, 275 s, and 70 s respectively, that is, the lower the temperature is, the longer the failure time is.

In FIG. 3, according to the Arrhenius equation, it can be deduced that the temperature corresponding to the retention time is 137° C., which is 52° C. higher than that of GST (85° C.). Automotive electronics require 10 years of retention at 120° C., so that a phase-change memory based on the $Sb_{60}Te_{30}Ti_{10}$ phase-change material can meet the requirement. At the time of obtaining the 10-year retention temperature, the crystallization activation energy of $Sb_{60}Te_{30}Ti_{10}$ may also be obtained. The crystallization activation energy of $Sb_{60}Te_{30}Ti_{10}$ is 3.5 ev, which is 1.2 ev higher than that of GST (2.3 ev). The increase of the crystallization activation energy improves the thermal stability in the amorphous state.

Figure 4:
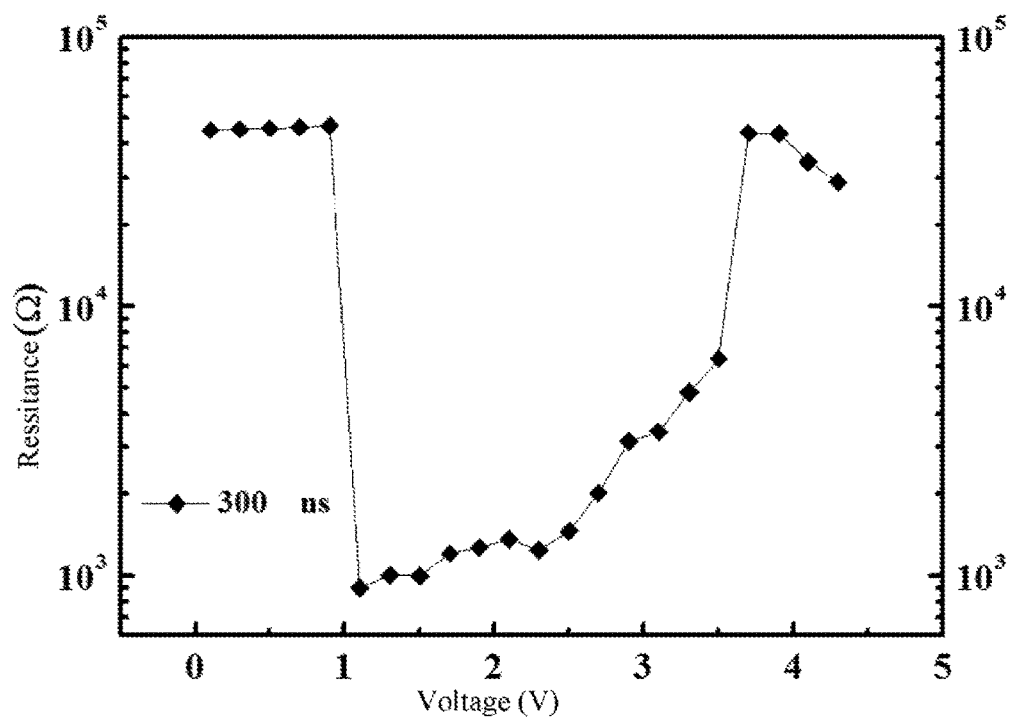
FIG. 4 shows a voltage-resistance curve of a phase-change device unit based on the Sb$_{60}$Te$_{30}$Ti$_{10}$ film in Embodiment 1.

FIG. 4 shows a voltage-resistance curve of a phase-change device unit based on the $Sb_{60}Te_{30}Ti_{10}$ film in Embodiment 1. A voltage pulse used for testing is 300 ns, and a falling edge of the pulse is 30 ns. It can be known from FIG. 4, a voltage required for transition from the amorphous state to the polycrystalline state is 1.1 V, and a voltage required for transition from the crystalline state to the amorphous state is 3.5 V. Therefore, the $Sb_{60}Te_{30}Ti_{10}$ nanocomposite phase-change material of this embodiment can undergo reversible phase change under the action of the voltage pulse.

When the $Sb_{60}Te_{30}Ti_{10}$ nanocomposite phase-change material of this embodiment is heated by a pulsed laser, the structure may reversibly change between the amorphous state and the polycrystalline state, thereby realizing reversible change of optical reflectivity.

Embodiment 2

Preparation of an $Sb_{72}Te_{18}Ti_{10}$ Nanocomposite Phase-Change Material

In this embodiment, the nanocomposite phase-change material is obtained by co-sputtering an $Sb_{72}Te_{18}$ alloy target and a Ti target. Specific preparation conditions are: in the process of co-sputtering, an Ar gas with a purity of 99.999% is fed at the same time, the $Sb_{72}Te_{18}$ target adopts a radio frequency power supply, the Ti target adopts a direct current power supply, the power of the adopted radio frequency power supply is 25 W, and the power of the adopted direct current power supply is 15 W. The $Sb_{72}Te_{18}$ target is started before the Ti target power supply is turned on. The co-sputtering duration is 30 minutes, and the thickness of a film is about 200 nm.

Tests of the $Sb_{72}Te_{18}Ti_{10}$ nanocomposite phase-change material obtained in this embodiment are performed, and results are as follows.

It can be known from a graph showing a relationship between the $Sb80Te10Ti_{10}$ sheet resistance and the temperature of the obtained $Sb_{72}Te_{18}Ti_{10}$ nanocomposite phase-change material at different heating rates that, the higher the heating rate is, the higher the crystallization temperature is.

The lower the test temperature of the obtained $Sb_{72}Te_{18}Ti_{10}$ nanocomposite phase-change material is, the longer the failure time is.

The obtained $Sb_{72}Te_{18}Ti_{10}$ nanocomposite phase-change material has a 10-year retention temperature, and while the 10-year retention temperature is obtained, the crystallization activation energy of $Sb_{72}Te_{18}Ti_{10}$ is much higher than that of GST (2.3 ev). The increase of the crystallization activation energy improves the thermal stability in the amorphous state.

The obtained $Sb_{72}Te_{18}Ti_{10}$ nanocomposite phase-change material can undergo reversible phase change under action of a voltage pulse; when being heated by a pulsed laser, the structure can reversibly change between the amorphous state and the polycrystalline state, thereby realizing reversible change of optical reflectivity.

Embodiment 3

Preparation of an $Sb_{50}Te_{30}Ti_{20}$ Nanocomposite Phase-Change Material

In this embodiment, the nanocomposite phase-change material is obtained by co-sputtering an $Sb_{50}Te_{30}$ alloy target and a Ti target. Specific preparation conditions are: in the process of co-sputtering, an Ar gas with a purity of 99.999% is fed at the same time, the $Sb_{50}Te_{30}$ target adopts a radio frequency power supply, the Ti target adopts a direct current power supply, the power of the adopted radio frequency power supply is 25 W, and the power of the adopted direct current power supply is 15 W. The Sb2Te target is started before the Ti target power supply is turned on. The co-sputtering duration is 50 minutes, and the thickness of a film is about 250 nm.

Tests of the $Sb_{50}Te_{30}Ti_{20}$ nanocomposite phase-change material obtained in this embodiment are performed, and results are as follows.

It can be known from a graph showing a relationship between $Sb_{50}Te_{30}Ti_{20}$ sheet resistance and the temperature of the obtained $Sb_{50}Te_{30}Ti_{20}$ nanocomposite phase-change material at different heating rates that, the higher the heating rate is, the higher the crystallization temperature is.

The lower the test temperature of the obtained $Sb_{50}Te_{30}Ti_{20}$ nanocomposite phase-change material is, the longer the failure time is.

The obtained $Sb_{50}Te_{30}Ti_{20}$ nanocomposite phase-change material has a 10-year retention temperature, and while the 10-year retention temperature is obtained, the crystallization activation energy of $Sb_{50}Te_{30}Ti_{20}$ is much higher than that of GST (2.3 ev). The increase of the crystallization activation energy improves the thermal stability in the amorphous state.

The obtained $Sb_{50}Te_{30}Ti_{20}$ nanocomposite phase-change material can undergo reversible phase change under action of a voltage pulse; when being heated by a pulsed laser, the structure can reversibly change between the amorphous state and the polycrystalline state, thereby realizing reversible change of optical reflectivity.

Embodiment 4

Preparation of an $Sb_{45}Te_{45}Ti_{10}$ Nanocomposite Phase-Change Material

In this embodiment, the nanocomposite phase-change material is obtained by co-sputtering an $Sb_{45}Te_{45}$ alloy target and a Ti target. Specific preparation conditions are: in the process of co-sputtering, an Ar gas with a purity of 99.999% is fed at the same time, the $Sb_{45}Te_{45}$ target adopts a radio frequency power supply, the Ti target adopts a direct current power supply, the power of the adopted radio frequency power supply is 25 W, and the power of the adopted direct current power supply is 15 W. The $Sb_{45}Te_{45}$ target is started before the Ti target power supply is turned on. The co-sputtering duration is 15 minutes, and the thickness of a film is about 100 nm.

Tests of the $Sb_{45}Te_{45}Ti_{10}$ nanocomposite phase-change material obtained in this embodiment are performed, and results are as follows.

It can be known from a graph showing a relationship between the $Sb_{45}Te_{45}Ti_{10}$ sheet resistance and the temperature of the obtained $Sb_{45}Te_{45}Ti_{10}$ nanocomposite phase-change material at different heating rates that, the higher the heating rate is, the higher the crystallization temperature is.

The lower the test temperature of the obtained $Sb_{45}Te_{45}Ti_{10}$ nanocomposite phase-change material is, the longer the failure time is.

The obtained $Sb_{45}Te_{45}Ti_{10}$ nanocomposite phase-change material has a 10-year retention temperature, and while the 10-year retention temperature is obtained, the crystallization activation energy of $Sb_{45}Te_{45}Ti_{10}$ is much higher than that of GST (2.3 ev). The increase of the crystallization activation energy improves the thermal stability in the amorphous state.

The obtained $Sb_{45}Te_{45}Ti_{10}$ nanocomposite phase-change material can undergo reversible phase change under action of a voltage pulse; when being heated by a pulsed laser, the structure can reversibly change between the amorphous state and the polycrystalline state, thereby realizing reversible change of optical reflectivity.

Embodiment 5

Preparation of an $Sb_{69}Te_{23}Ti_8$ Nanocomposite Phase-Change Material

In this embodiment, the nanocomposite phase-change material is obtained by co-sputtering an $Sb_{69}Te_{23}$ alloy target and a Ti target. Specific preparation conditions are: in the process of co-sputtering, an Ar gas with a purity of 99.999% is fed at the same time, the $Sb_{69}Te_{23}$ target adopts a radio frequency power supply, the Ti target adopts a direct current power supply, the power of the adopted radio frequency power supply is 25 W, and the power of the adopted direct current power supply is 15 W. The $Sb_{69}Te_{23}$ target is started before the Ti target power supply is turned on. The co-sputtering duration is 20 minutes, and the thickness of a film is about 160 nm.

Tests of the $Sb_{69}Te_{23}Ti_8$ nanocomposite phase-change material obtained in this embodiment are performed, and results are as follows.

It can be known from a graph showing a relationship between $Sb_{69}Te_{23}Ti_8$ sheet resistance and temperature of the obtained $Sb_{69}Te_{23}Ti_{85}$ nanocomposite phase-change material at different heating rates that, the higher the heating rate is, the higher the crystallization temperature is.

The lower the test temperature of the obtained $Sb_{69}Te_{23}Ti_8$ nanocomposite phase-change material is, the longer the failure time is.

The obtained $Sb_{69}Te_{23}Ti_8$ nanocomposite phase-change material has a 10-year retention temperature, and while the 10-year retention temperature is obtained, the crystallization activation energy of $Sb_{69}Te_{23}Ti_8$ is much higher than that of GST (2.3 ev). The increase of the crystallization activation energy improves the thermal stability in the amorphous state.

The obtained $Sb_{69}Te_{23}Ti_8$ nanocomposite phase-change material can undergo reversible phase change under action of a voltage pulse; when being heated by a pulsed laser, the structure may reversibly change between the amorphous state and the polycrystalline state, thereby realizing reversible change of optical reflectivity.

Embodiment 6

Preparation of Ti—$Sb_2Te_3$ Phase-Change Memory Materials Doped with Ti with Percentage Contents of Ti Atom of 6%, 8% and 10% Respectively, and an $Sb_2Te_3$ Phase-Change Memory Material without being Doped with Ti In this embodiment, the Ti—$Sb_2Te_3$ phase-change memory material is obtained by co-sputtering an $Sb_2Te_3$ alloy target and a Ti target. Specific preparation conditions are: in the process of co-sputtering, an Ar gas with a purity of 99.999% is fed at the same time, the $Sb_2Te_3$ target adopts a radio frequency power supply, the Ti target adopts a direct current power supply, the power of the adopted radio frequency power supply is 25 W, and the power of the adopted direct current power supply is 15 W. The $Sb_2Te_3$ target is started before the Ti target power supply is turned on. The co-sputtering duration may be controlled according to the thickness of a film that undergoes phase change. In this embodiment, the $Sb_2Te_3$ phase-change memory material is obtained by sputtering an $Sb_2Te_3$ alloy target.

Tests of the Ti—$Sb_2Te_3$ phase-change memory material doped with Ti and the $Sb_2Te_3$ phase-change memory material without being doped with Ti that are obtained in this embodiment are performed, and results are shown in FIG. 5 to FIG. 8.

Figure 5:
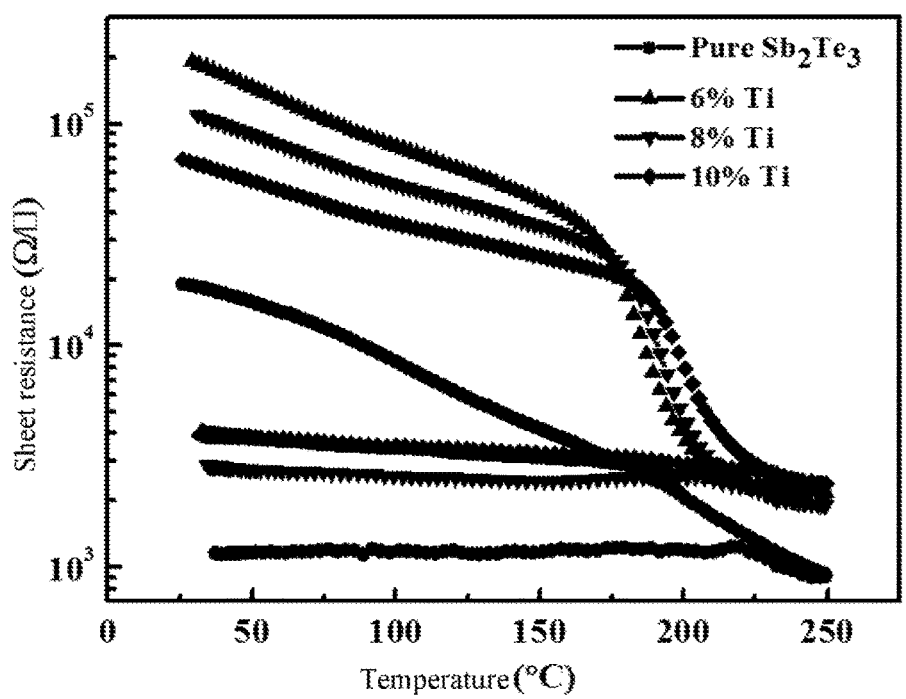
FIG. 5 shows sheet-resistance-temperature curves of Sb$_2$Te$_3$ and three Ti—Sb$_2$Te$_3$ films having different contents of Ti at a heating rate of 10° C./min in Embodiment 6.

FIG. 5 shows temperature-resistance curves of a pure $Sb_2Te_3$ film and Ti—$Sb_2Te_3$ films doped with Ti of different contents at a heating rate of 10° C./min. According to FIG. 5, the initial resistance of pure $Sb_2Te_3$ is very low, because deposited $Sb_2Te_3$ has been partially crystallized. It can be seen from a crystallization temperature that, the higher the Ti content is, the higher the crystallization temperature is. The crystallization temperatures of Ti—$Sb_2Te_3$ films doped with 6% Ti, 8% Ti, and 10% Ti are 176° C., 185° C., and 194° C. respectively. In view of amorphous state resistance, when being doped with 6% Ti, the resistance in the amorphous state is an order of magnitude higher than that of pure $Sb_2Te_3$, and the amorphous state resistance when being doped with 8% and 10% Ti is lower than that when being doped with 6% Ti. As the content of the doped Ti increases, the high-resistance-to-low-resistance ratio increases and then decreases. However, the Ti—$Sb_2Te_3$ films doped with 6% Ti, 8% Ti, and 10% Ti all have a significantly improved thermal stability.

Figure 6:
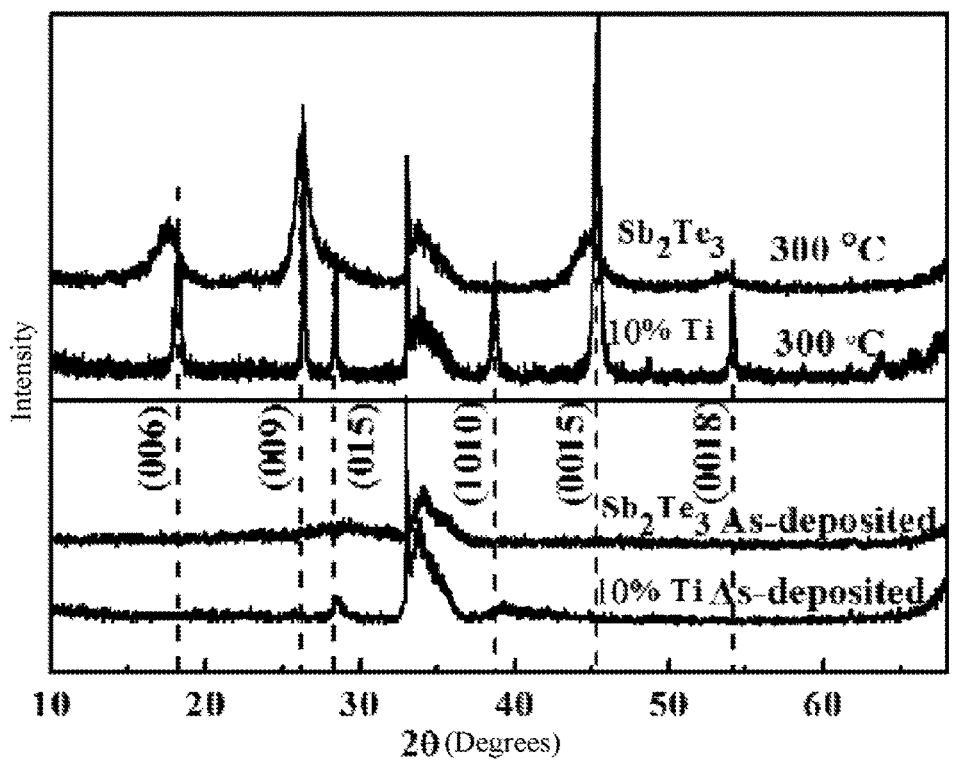
FIG. 6 shows an X-ray diffraction result of an Sb$_2$Te$_3$ and a Ti—Sb$_2$Te$_3$ film doped with 10% Ti after annealing for 5 minutes at 300° C. in Embodiment 6.

As shown in FIG. 6, deposited pure $Sb_2Te_3$ already has a diffraction peak, which proves that the deposited pure $Sb_2Te_3$ has been partially crystallized. The Ti—$Sb_2Te_3$ film doped with 10% Ti does not have any diffraction peak, and is in the amorphous state. Therefore, it can be known that the crystallization temperature of the Ti—$Sb_2Te_3$ film doped with Ti really increases. It can be known from a comparison result between XRD of pure $Sb_2Te_3$ and that of Ti—$Sb_2Te_3$ doped with 10% Ti that are annealed at 300° C. that, the two crystals have the same diffraction peak, so the crystal structure of Ti—$Sb_2Te_3$ doped with Ti is not changed, that is, phase separation does not occur. However, the intensity of the diffraction peak of Ti—$Sb_2Te_3$ doped with Ti decreases, indicating that after being doped, gains become smaller.

Figure 7:
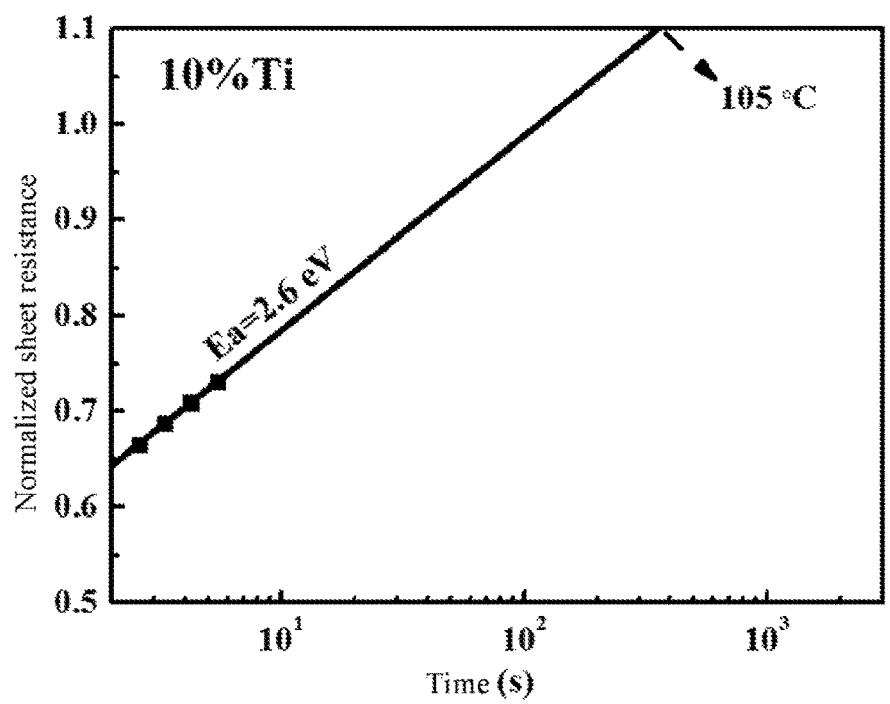
FIG. 7 shows the data retention of Ti—Sb$_2$Te$_3$ doped with 10% Ti in Embodiment 6.

As shown in FIG. 7, according to the Arrhenius equation, it can be deduced that the temperature corresponding to the retention time of Ti—$Sb_2Te_3$ doped with 10% Ti is 105° C., which is 20° C. higher than that of GST (85° C.). The requirement of consumer electronics for retention is ensuring storage at 80° C. for 10 years, so Ti—$Sb_2Te_3$ doped with 10% Ti meets the requirement.

Figure 8:
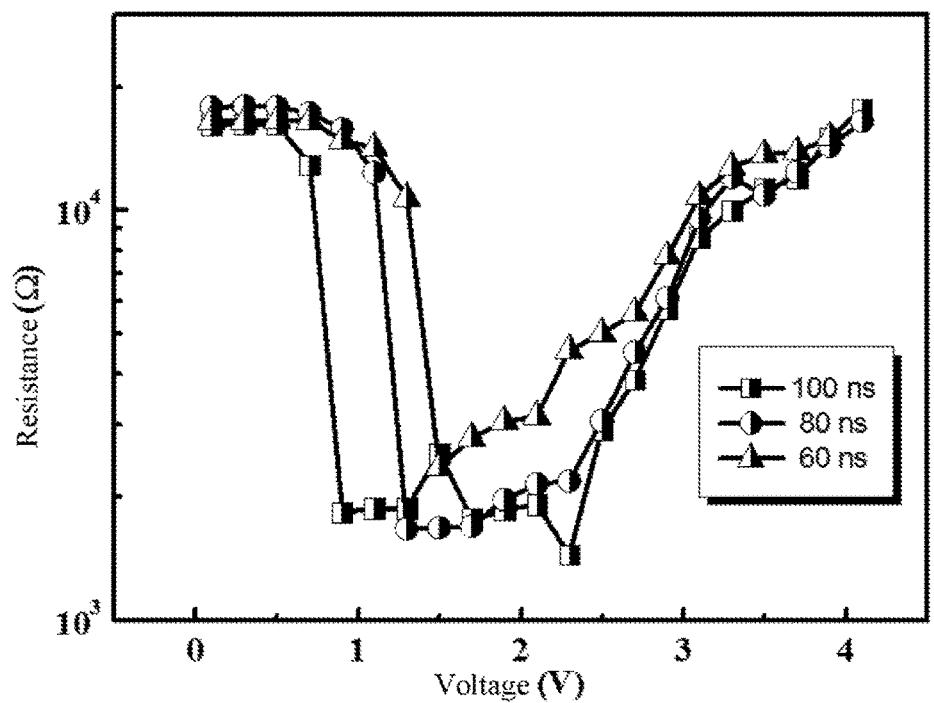
FIG. 8 shows resistance-voltage curves of a phase-change memory device unit based on Ti—Sb$_2$Te$_3$ doped with 10% Ti in Embodiment 6.

FIG. 8 shows resistance-voltage curves of a phase-change memory device based on a Ti—$Sb_2Te_3$ phase-change material doped with 10% Ti. It can be seen from FIG. 4 that, at 100 ns, voltages required for Set and Reset are 1 V and 3.3 V respectively. After pulse width decreases, Set and Reset operations can still be tested, but the voltage required for the Set operation increases. Therefore, the phase-change memory device based on the Ti—$Sb_2Te_3$ phase-change material doped with 10% Ti has a high crystallization rate, and can reversibly change between the amorphous state and the crystalline state on the order of nanosecond.

Embodiment 7

Preparation of Ti—$Sb_2Te_3$ Phase-Change Memory Materials Doped with Ti of a Percentage Content of Ti Atom of 2%

In this embodiment, the Ti—$Sb_2Te_3$ phase-change memory material is obtained by co-sputtering an $Sb_2Te_3$ alloy target and a Ti target. Specific preparation conditions are: in the process of co-sputtering, an Ar gas with a purity of 99.999% is fed at the same time, the $Sb_2Te_3$ target adopts a radio frequency power supply, the Ti target adopts a direct current power supply, the power of the adopted radio frequency power supply is 25 W, and the power of the adopted direct current power supply is 15 W. The $Sb_2Te_3$ target is started before the Ti target power supply is turned on. The co-sputtering duration may be controlled according to the thickness of a film that undergoes phase change. In this embodiment, the $Sb_2Te_3$ phase-change memory material is obtained by sputtering an $Sb_2Te_3$ alloy target.

Tests of the Ti—$Sb_2Te_3$ phase-change memory material doped with Ti and obtained in this embodiment are performed, and results are as follows.

In the Ti—$Sb_2Te_3$ phase-change memory material doped with 2% Ti, Ti atoms replace Sb atoms, and phase separation does not occur.

In the Ti—$Sb_2Te_3$ phase-change memory material doped with 2% Ti, the resistivity is reversibly changed under the action of an electric pulse.

In the Ti—$Sb_2Te_3$ phase-change memory material doped with 2% Ti, the optical reflectivity is reversibly changed under the action of a laser pulse.

The amorphous state resistance of the Ti—$Sb_2Te_3$ phase-change memory material doped with 2% Ti is an order of magnitude higher than that of pure $Sb_2Te_3$.

The crystallization temperature of the Ti—$Sb_2Te_3$ phase-change memory material doped with 2% Ti is significantly risen, the thermal stability is significantly improved, and the data retention is enhanced.

The melting point and the thermal conductivity of the Ti—$Sb_2Te_3$ phase-change memory material doped with 2% Ti are lowered.

It can be known from a comparison result between XRD of Ti—$Sb_2Te_3$ doped with 2% Ti and that of pure $Sb_2Te_3$ that are annealed at 300° C., the two crystals have the same diffraction peak, so the crystal structure of the Ti—$Sb_2Te_3$ doped with Ti is not changed, that is, phase separation does not occur. However, the intensity of the diffraction peak of Ti—$Sb_2Te_3$ doped with Ti decreases, indicating that after being doped, gains become smaller.

It can be known from the resistance-voltage curves of the phase-change memory device based on the Ti—$Sb_2Te_3$ phase-change material doped with 2% Ti that, the phase-change memory device based on the Ti—$Sb_2Te_3$ phase-change material doped with 2% Ti has a higher crystallization rate, and can reversibly change between the amorphous state and the crystalline state on the order of nanosecond.

Embodiment 8

Preparation of Ti—$Sb_2Te_3$ Phase-Change Memory Materials Doped with Ti of a Percentage Content of Ti Atom of 20%

In this embodiment, the Ti—$Sb_2Te_3$ phase-change memory material is obtained by co-sputtering an $Sb_2Te_3$ alloy target and a Ti target. Specific preparation conditions are: in the process of co-sputtering, an Ar gas with a purity of 99.999% is fed at the same time, the $Sb_2Te_3$ target adopts a radio frequency power supply, the Ti target adopts a direct current power supply, the power of the adopted radio frequency power supply is 25 W, and the power of the adopted direct current power supply is 15 W. The $Sb_2Te_3$ target is started before the Ti target power supply is turned on. The co-sputtering duration may be controlled according to the thickness of a film that undergoes phase change. In this embodiment, the $Sb_2Te_3$ phase-change memory material is obtained by sputtering an $Sb_2Te_3$ alloy target.

Tests of the Ti—$Sb_2Te_3$ phase-change memory material doped with Ti and obtained in this embodiment are performed, and results are as follows.

In the Ti—$Sb_2Te_3$ phase-change memory material doped with 20% Ti, Ti atoms replace Sb atoms, and phase separation does not occur.

In the Ti—$Sb_2Te_3$ phase-change memory material doped with 20% Ti, the resistivity is reversibly changed under the action of an electric pulse.

In the Ti—$Sb_2Te_3$ phase-change memory material doped with 20% Ti, the optical reflectivity is reversibly changed under the action of a laser pulse.

The crystallization temperature of the Ti—$Sb_2Te_3$ phase-change memory material doped with 20% Ti is significantly risen, the thermal stability is significantly improved, and the data retention is enhanced.

The melting point and the thermal conductivity of the Ti—$Sb_2Te_3$ phase-change memory material doped with 20% Ti are lowered.

It can be known from a comparison result between XRD of annealing of Ti—$Sb_2Te_3$ doped with 20% Ti and that of annealing of pure $Sb_2Te_3$ at 300° C. that, the two crystals have the same diffraction peak, so the crystal structure of the Ti—$Sb_2Te_3$ doped with Ti is not changed, that is, phase separation does not occur. However, the intensity of the diffraction peak of Ti—$Sb_2Te_3$ doped with Ti decreases, indicating that after being doped, gains become smaller.

According to the Arrhenius equation, it can be deduced that the temperature corresponding to the retention time of Ti—$Sb_2Te_3$ doped with 20% Ti is higher than that of GST (85° C.). The requirement of consumer electronics for retention is ensuring storage at 80° C. for 10 years, so Ti—$Sb_2Te_3$ doped with 20% Ti meets the requirement.

It can be known from the resistance-voltage curves of the phase-change memory device based on the Ti—Sb$_2$Te$_3$ phase-change material doped with 20% Ti that, the phase-change memory device based on the Ti—Sb$_2$Te$_3$ phase-change material doped with 20% Ti has a higher crystallization rate, and can reversibly change between the amorphous state and the crystalline state on the order of nanosecond.

Embodiment 9

Preparation of Ti—Sb$_2$Te$_3$ Phase-Change Memory Materials Doped with Ti of a Percentage Content of Ti Atom of 40%

In this embodiment, the Ti—Sb$_2$Te$_3$ phase-change memory material is obtained by co-sputtering an Sb$_2$Te$_3$ alloy target and a Ti target. Specific preparation conditions are: in the process of co-sputtering, an Ar gas with a purity of 99.999% is fed at the same time, the Sb$_2$Te$_3$ target adopts a radio frequency power supply, the Ti target adopts a direct current power supply, the power of the adopted radio frequency power supply is 25 W, and the power of the adopted direct current power supply is 15 W. The Sb$_2$Te$_3$ target is started before the Ti target power supply is turned on. The co-sputtering duration may be controlled according to the thickness of a film that undergoes phase change. In this embodiment, the Sb$_2$Te$_3$ phase-change memory material is obtained by sputtering an Sb$_2$Te$_3$ alloy target.

Tests of the Ti—Sb$_2$Te$_3$ phase-change memory material doped with Ti and obtained in this embodiment are performed, and results are as follows.

In the Ti—Sb$_2$Te$_3$ phase-change memory material doped with 40% Ti, Ti atoms replace Sb atoms, and phase separation does not occur.

In the Ti—Sb$_2$Te$_3$ phase-change memory material doped with 40% Ti, the resistivity is reversibly changed under the action of an electric pulse.

In the Ti—Sb$_2$Te$_3$ phase-change memory material doped with 40% Ti, the optical reflectivity is reversibly changed under the action of a laser pulse.

The crystallization temperature of the Ti—Sb$_2$Te$_3$ phase-change memory material doped with 40% Ti is significantly risen, the thermal stability is significantly improved, and the data retention is enhanced.

The melting point and the thermal conductivity of the Ti—Sb$_2$Te$_3$ phase-change memory material doped with 40% Ti are lowered.

Phase change memory cell based on Ti$_{0.4}$—Sb$_2$Te$_3$ alloy, showing one order of magnitude faster Set operation speed and as low as one-fifth Reset operation power, compared with Ge$_2$Sb$_2$Te$_5$-based phase change memory cell at the same size. The enhancements are rooted in the common presence of titanium-centered octahedral motifs in both amorphous and crystalline Ti$_{0.4}$—Sb$_2$Te$_3$ phases. The essentially unchanged local structures around the titanium atoms are responsible for the significantly improved performance, as these structures could act as nucleation centers to facilitate a swift, low-energy order-disorder transition for the rest of the Sb-centered octahedrons. In that case, substantial atomic rearrangement is avoided. Time dependent in situ electron beam irradiation experiment confirms this nucleation dominated mechanism for crystallization of a TST.

For a T-shaped PCM cell with a diameter (D) of 190 nm bottom electrode contact (BEC), the magnitude if applied voltage pulse reaches 1.3V, the Ti$_{0.4}$—Sb$_2$Te$_3$ cell shows a set speed of ~6 ns, while the GST cell with the same size requires ~75 ns even at 1.6V. Namely one order of magnitude faster Set speed can be achieved. The Ti$_{0.4}$—Sb$_2$Te$_3$ cell is reasonably stable, too, as after ~10$^7$ cycles, Ti, Sb and Te are still uniformly distributed without any sign of severe segregation.

Tests of the Ti—Sb$_2$Te$_3$ phase-change memory material doped with Ti which is obtained in this embodiment show that even the Reset energy of the Ti$_{0.4}$—Sb$_2$Te$_3$ cell with D=190 nm BEC (3.12×10$^{-9}$ J), can be noticeably less than that of the Ge$_2$Sb$_2$Te$_5$ cell with much smaller D=80 nm BEC (4.2010$^{-9}$ J), and a substantial reduction (~78%) of Reset energy is achieved on Ti$_{0.4}$—Sb$_2$Te$_3$ cell with the same D=80 nm, BEC (0.95×10$^{-9}$ J) as Ge$_2$Sb$_2$Te$_5$ cell. And 82% reduction of Reset current obtained on the Ti$_{0.4}$—Sb$_2$Te$_3$ cell, compared with the Ge$_2$Sb$_2$Te$_5$ cell with the same D=80 nm BEC. Such swift and low energy switching features, at the same time, do not affect the stability of the both the Set and Reset data states of the Ti$_{0.4}$—Sb$_2$Te$_3$ cell. Descriptions and applications of the embodiments of the present invention are illustrative, and are not intended to limit the scope of the present invention to the aforementioned embodiments. Variations and modifications may be made to the embodiments disclosed herein. For persons of ordinary skill in the art, various equivalent components for replacement performed on the embodiments are well-known. It should be understood by persons skilled in the art that the present invention may be implemented in other forms, structures, arrangements and scales and by using other substrates, materials, and components without departing from the spirit or essence of the present invention. Other variations and modifications may be made to the embodiments disclosed herein without departing from the scope and spirit of the present invention.

What is claimed is:

1. An Sb—Te—Ti phase-change memory material for a phase-change memory, formed by doping an Sb—Te phase-change memory material with Ti, the Sb—Te—Ti phase-change memory material having a chemical formula of Sb$_{60}$Te$_{30}$Ti$_{10}$.

* * * * *